United States Patent
Liu

(12) 
(10) Patent No.: US 6,395,646 B1
(45) Date of Patent: May 28, 2002

(54) MACHINE FOR ETCHING THE EDGE OF A WAFER AND METHOD OF ETCHING THE EDGE OF A WAFER

(75) Inventor: Yueh-liang Liu, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/548,534

(22) Filed: Apr. 13, 2000

(30) Foreign Application Priority Data

Jul. 19, 1999 (TW) ........................................ 88112213 A

(51) Int. Cl.[7] .............................................. H01L 21/00
(52) U.S. Cl. ..................... 438/747; 156/345; 216/91; 216/99; 438/753; 438/745
(58) Field of Search ................................ 438/745, 747, 438/753, 748; 156/345 L; 216/91, 92, 99

(56) References Cited

U.S. PATENT DOCUMENTS 4,557,785 A * 12/1985 Ohkuma .................... 216/91 X
5,874,366 A *  2/1999 Sporer et al. ............. 216/91 X

* cited by examiner

*Primary Examiner*—William A. Powell
(74) *Attorney, Agent, or Firm*—Ladas & Parry

(57) ABSTRACT

A machine for etching the edge of a wafer comprising a rotating holding plate having a work platform, the work platform having a first fillister for spraying gas to maintain a certain distance between the work platform and the wafer, a second fillister set around the periphery of the first fillister for reducing pressure of the sprayed gas at the edge of the wafer, and a plurality of holding pins; a vacuum manipulator; and an etching solution leading apparatus.

10 Claims, 6 Drawing Sheets

MACHINE FOR ETCHING THE EDGE OF A WAFER AND METHOD OF ETCHING THE EDGE OF A WAFER

BACKGROUND OF THE INVENTION

1. Field of the Invention

The present invention relates to a machine for etching the edge of a wafer. More particularly, it relates to a machine which can effectively remove the Si-needles on the edge of a wafer.

2. Description of the Prior Art

In order to increase the yields in the DRAM (dynamic random access memory) manufacturing, global wafer lithography methods are widely applied. Although the yields can be increased in this manner, there remain some difficulties related to the deep trench process.

FIG. 1 illustrates, in cross section, the conventional deep trench process. Referring to FIG. 1, a silicon wafer is provided as a semiconductor substrate 10. Then, the silicon dioxide layer 12, the silicon nitride layer 14 and the boron glass layer (not shown) are sequentially formed on the substrate 10. Each of the silicon dioxide layer 12, the silicon nitride layer 14 and the boron glass layer is called a hard mask layer. An anisotropic etching is performed to etch the boron glass layer, the silicon nitride layer 14, the silicon dioxide layer 12 and the substrate 10 to a certain depth to form deep trenches 15. The photoresist layer and the boron layer are removed, while the silicon nitride layer 14, the silicon dioxide layer 12 and a portion of the substrate 10 are left to form the Si-needles 16.

As global wafer lithography is used, Si-needles 16 are distributed across the whole wafer. When a clamp manipulator is used to transport the wafer, it grips the edge of the wafer and contacts the Si-needles, resulting in the breakage of a number of Si-needles, as illustrated in FIG. 2. The broken Si-needles are left on the wafer, increasing the probability of wafer damage and decreasing yields.

Therefore, in the prior art, the Si-needles on the edge of the frontside of the wafer are removed, as illustrated in FIG. 3. Thus, the edge of the wafer is smooth, and when the clamp manipulator is used to grip the edge of the wafer, Si-needles will not be broken.

The conventional method for removing the Si-needles on the edge of the frontside of the wafer is described as follows. Referring to FIG. 4, a photoresist layer is formed on the central part of the frontside of the substrate 10 shown in FIG. 1. Then, a dry etching is performed using the photoresist layer as a mask to etch the hard mask layer of the edge of the wafer, wherein the Si-needles are still left. Then, the substrate 10 is put on a single wafer machine and a backside etching is performed to remove the Si-needles on the edge of the frontside of the wafer.

FIGS. 5 through 7 illustrate the conventional single wafer etching machine, wherein FIG. 5 illustrates a top view, FIG. 6 illustrates the cross section I–I' of FIG. 5, and FIG. 7 illustrates the J–J' cross section of FIG. 5. The conventional single wafer etching machine comprises: a rotating holding plate 20 having a work platform, the work platform having a vacuum manipulator 21 (not shown), a gas spraying fillister 22, a plurality of holding pins 24, and an etching solution leading apparatus 26.

The vacuum manipulator 21 is used to grip and move the wafer 10 to a position between the work platform and the etching solution leading apparatus 26, wherein the frontside of the wafer faces towards the work platform and the backside of the wafer faces towards the etching solution leading apparatus 26.

The gas spraying fillister 22 is used to spray gas and thus maintain a certain distance between the frontside of the wafer and the work platform.

The holding pins 24 are used to fix and release the edge of the wafer 10 and rotate the wafer 10.

The etching solution leading apparatus 26 is set facing towards work platform and is used to lead etching solution to the back side of the wafer.

However, the method described above has the disadvantages described as follows: (1) it needs an additional photoresist layer, (2) due to the small space between the wafer and the work platform, the gas sprayed by the gas spraying fillister will generate a resistance, resulting in too little of the etching solution permeating-back on the frontside of the wafer thus, the removal of Si-needles on the edge of the wafer to be inadequate.

SUMMARY OF THE INVENTION

Accordingly, an object of the present invention is to provide a machine for etching the edge of a wafer having a frontside and a backside. The machine according to the present invention comprises: a rotating holding plate, an etching solution leading apparatus and at least one vacuum manipulator.

The rotational speed of the rotating holding plate is between 150 and 300 rpm. The rotating holding plate has a work platform. The work platform has a first fillister for spraying gas, a plurality of holding pins and an etching solution permeating-back fillister. The gas sprayed from the first fillister is used to maintain a certain distance between the frontside of the wafer and the work platform. Preferably, the gas is nitrogen. The holding pins are used for fixing and releasing the edge of the wafer and rotating the wafer. Preferably, there are six holding pins. The holding pins can be cylindrical-shaped and distributed equally around the work platform.

A second fillister is set around the periphery of the first fillister facing the edge of the frontside of the wafer. By reducing the pressure of the sprayed gas at the edge of the frontside of the wafer, the second fillister allows etching solution to easily permeate to the edge of the frontside of the wafer.

The etching solution leading apparatus is set facing towards the work platform and is used to lead etching solution to the backside of the wafer.

The vacuum manipulator is used to grip and move the wafer to a position between the work platform and the etching solution leading apparatus, wherein the frontside of the wafer faces towards the work platform and the backside of the wafer faces towards the etching solution leading apparatus.

Moreover, another objective of the present invention is to provide a method of etching the edge of a wafer having a frontside and a backside with a single wafer etching machine having a work platform with a first fillister and a second fillister set around the periphery of the first fillister, an etching solution leading apparatus, and a plurality of holding pins. The first step of the method for etching the edge of a wafer comprises spraying the gas from the first gas fillister. The wafer to be etched is then disposed on the work platform of the rotating holding plate, wherein the frontside of the wafer faces towards the work platform and the backside of the wafer faces towards the etching solution leading apparatus. Next, the gas sprayed on the frontside of the wafer maintains a certain distance between the frontside of the wafer and the work platform. The holding pins are contacted with the wafer, fixing the wafer such that the wafer can be rotated by the holding plate. Etching solution is lead from the etching solution leading apparatus to the backside of the wafer, such that the etching solution gradually diffuses to the edge of the backside of the wafer, and then permeates around to the edge of the frontside of the wafer, thereby etching the Si-needles at the edge of the frontside of the wafer. The wafer is released briefly by the holding pins and then gripped again, such that the edge of the wafer originally gripped by the holding pins is also etched.

Since the second fillister set around the periphery of the first fillister effectively reduces the gas pressure between the wafer and the workplatform in the area facing the edge of the frontside of the wafer, the etching solution easily permeates to the edge of the frontside of the wafer. Therefore, the photoresist is not necessary.

BRIEF DESCRIPTION OF THE DRAWINGS

The following detailed description, given by way of examples and not intended to limit the invention to the embodiments described herein, will best be understood in conjunction with the accompanying drawings, in which.

DETAILED DESCRIPTION OF THE INVENTION

Figure 1:
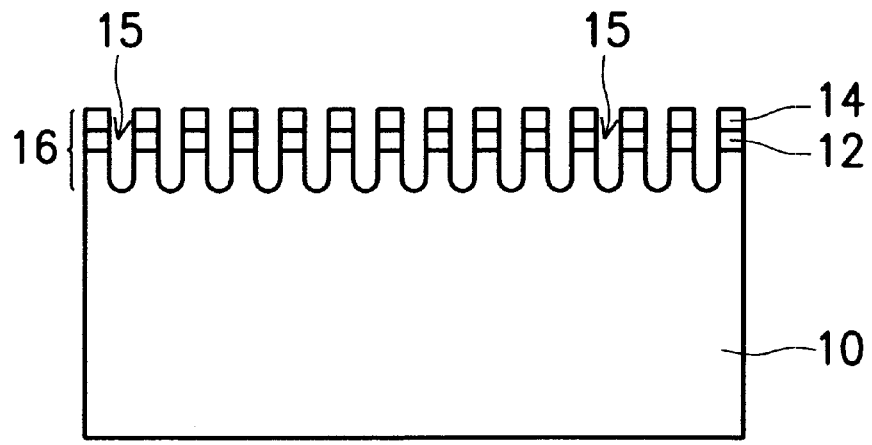
FIG. 1 illustrates, in cross section, the deep trench and Si-needle structures of a wafer.
Figure 2:
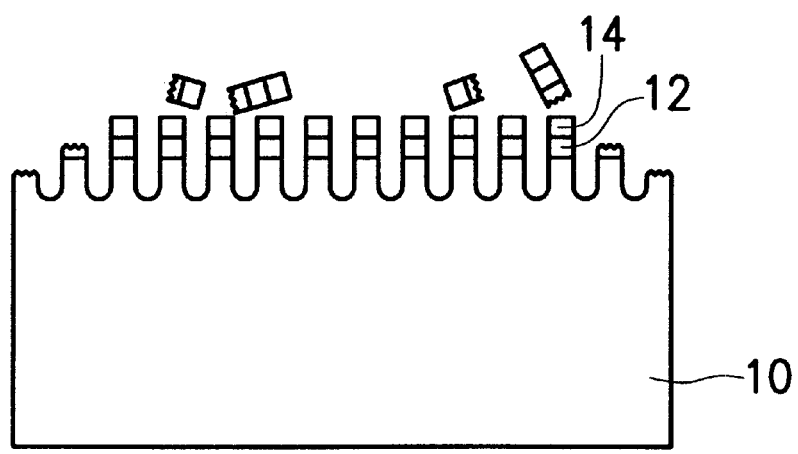
FIG. 2 illustrates, in cross section, the Si-needles broken by a clamp manipulator.
Figure 3:
FIG. 3 illustrates, in cross section, a wafer with the Si-needles at the edge removed.
Figure 4:
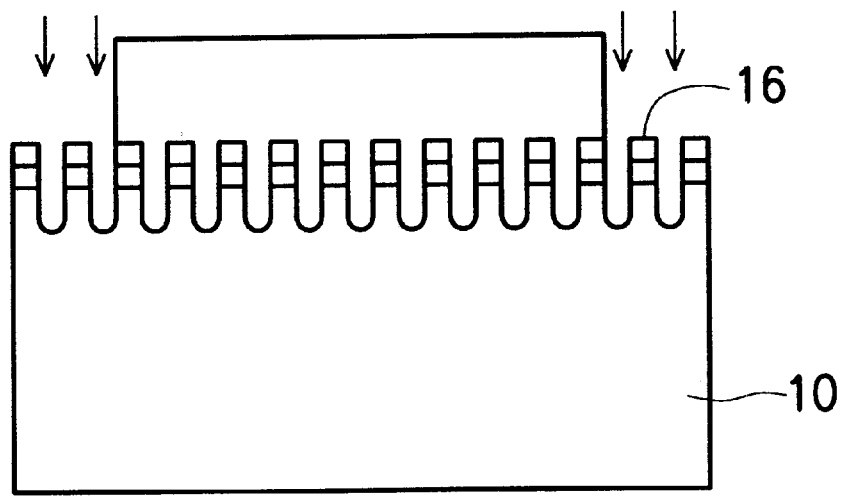
FIG. 4 illustrates, in cross section, the method for removing the Si-needles at the edge according to the prior art.
Figure 5:
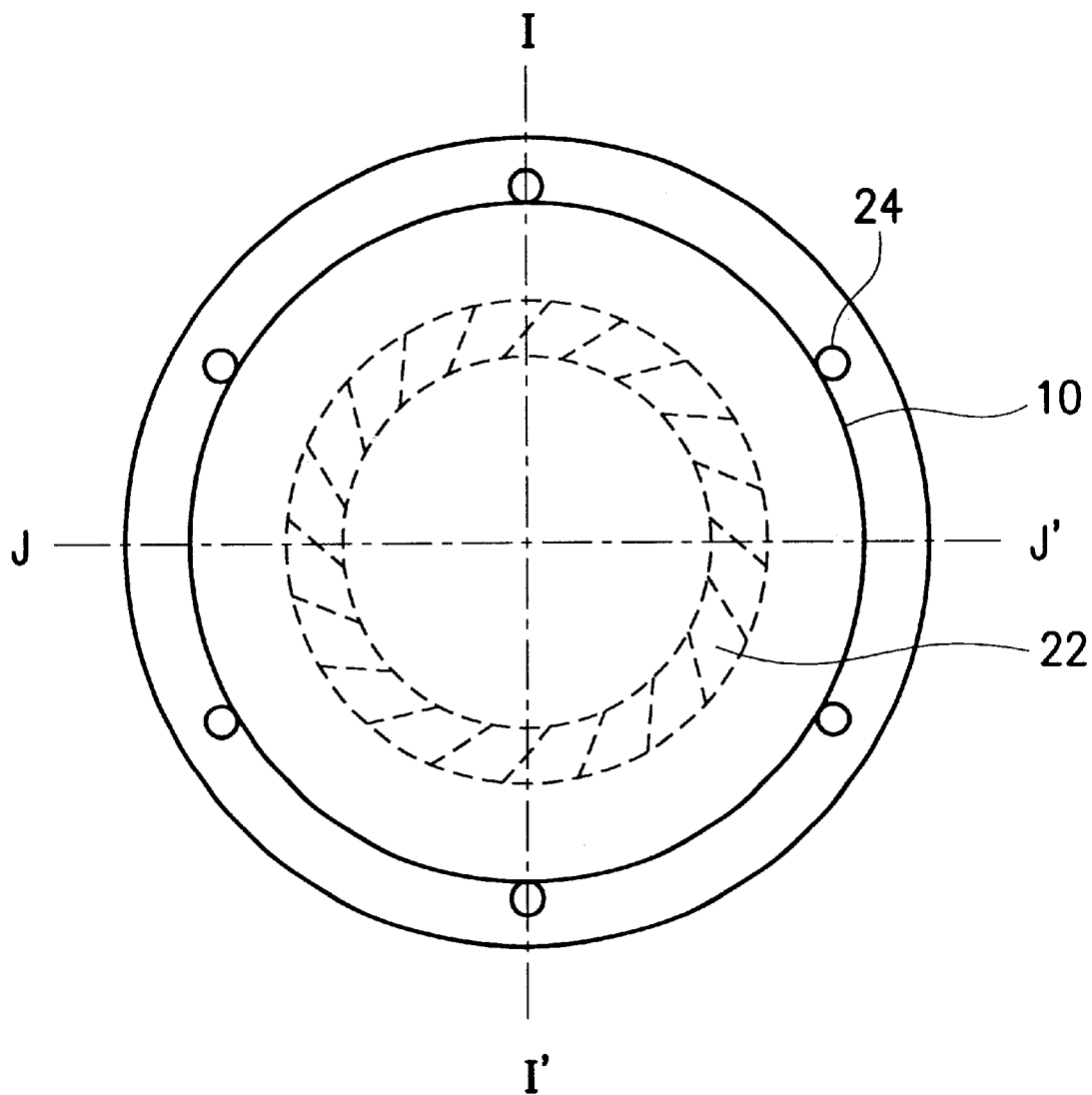
FIG. 5 illustrates a top view of the conventional etching machine.
Figure 6:
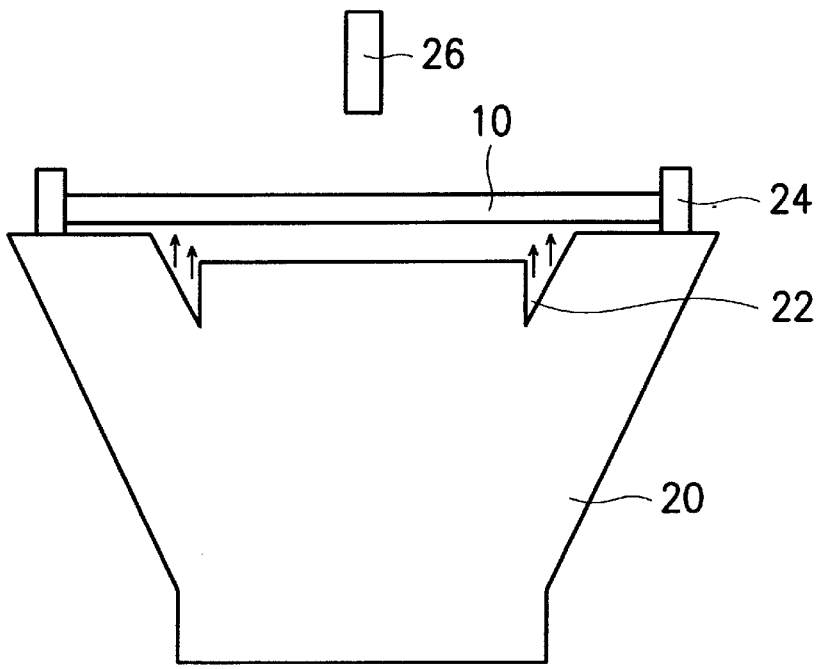
FIG. 6 illustrates the I–I' cross section of FIG. 5.
Figure 7:
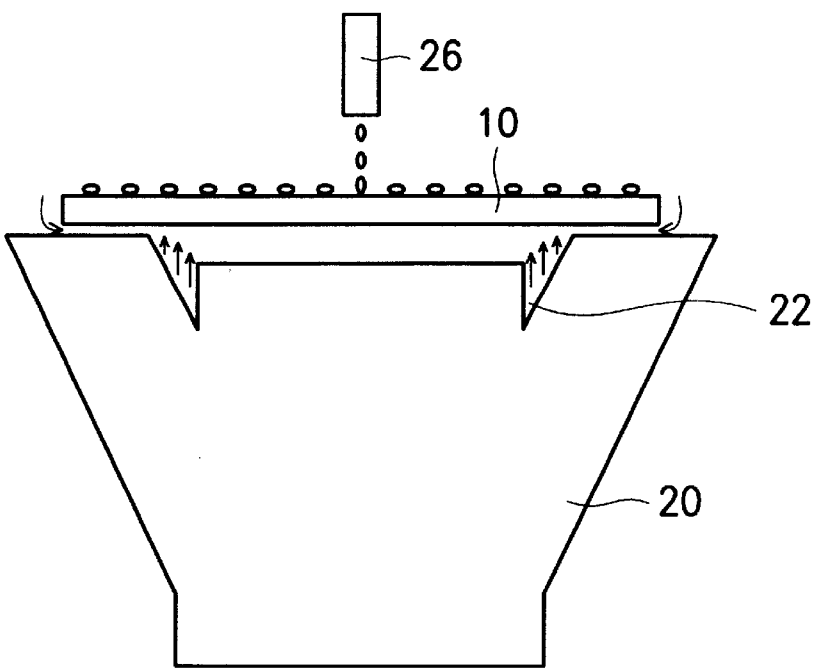
FIG. 7 illustrates the J–J' cross section of FIG. 5.
Figure 8:
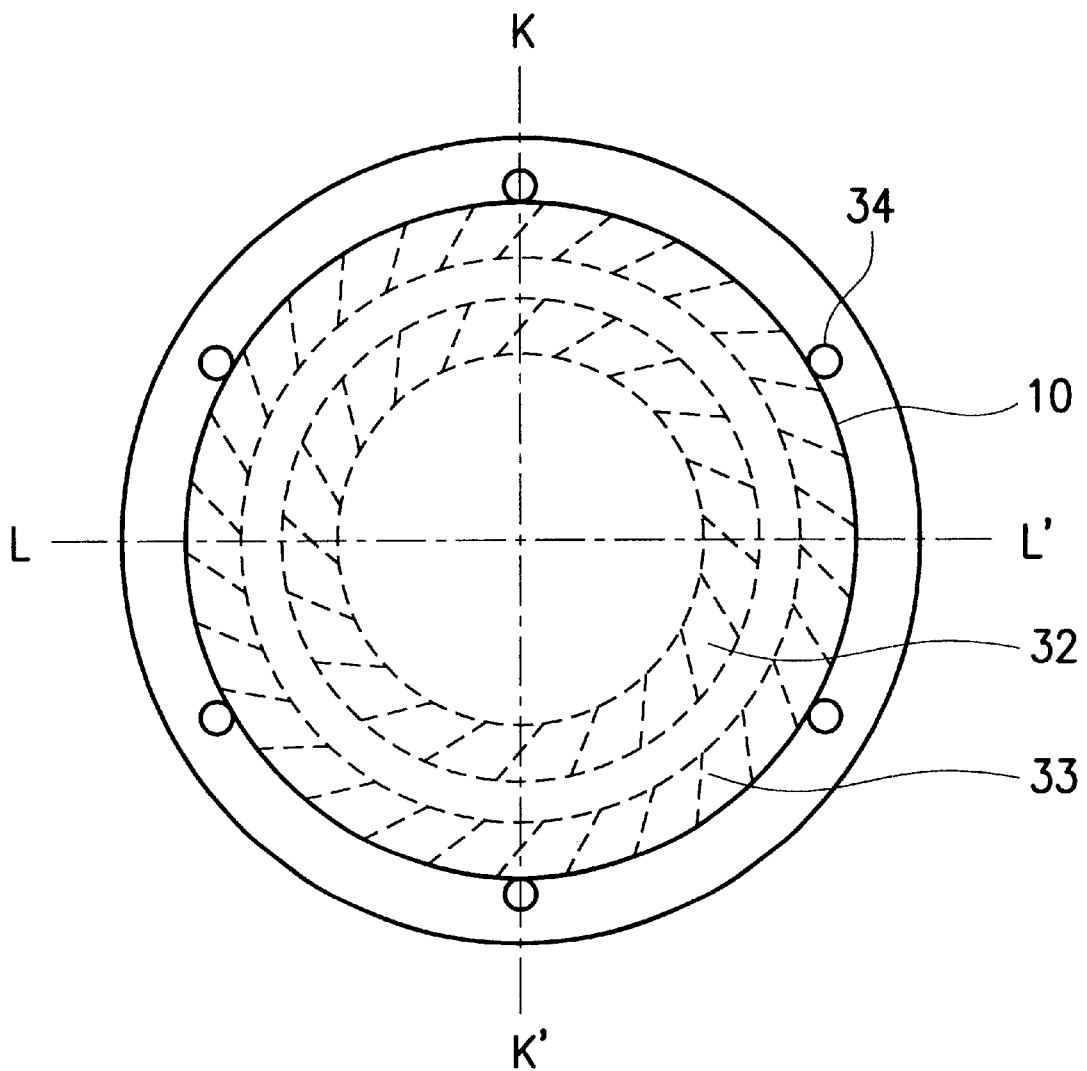
FIG. 8 illustrates the top view of the machine according to the present invention.
Figure 9:
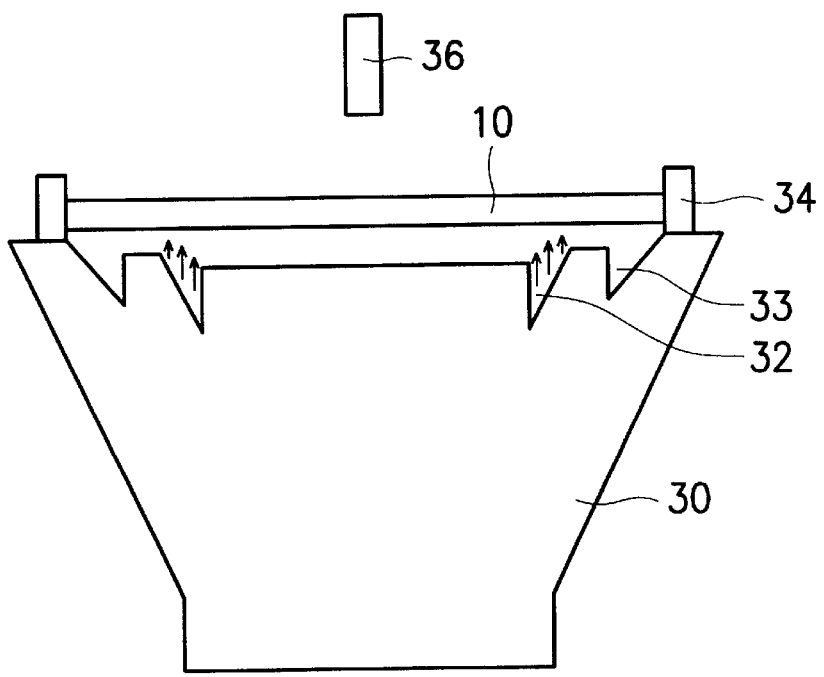
FIG. 9 illustrates the K–K' cross section of FIG. 8.
Figure 10:
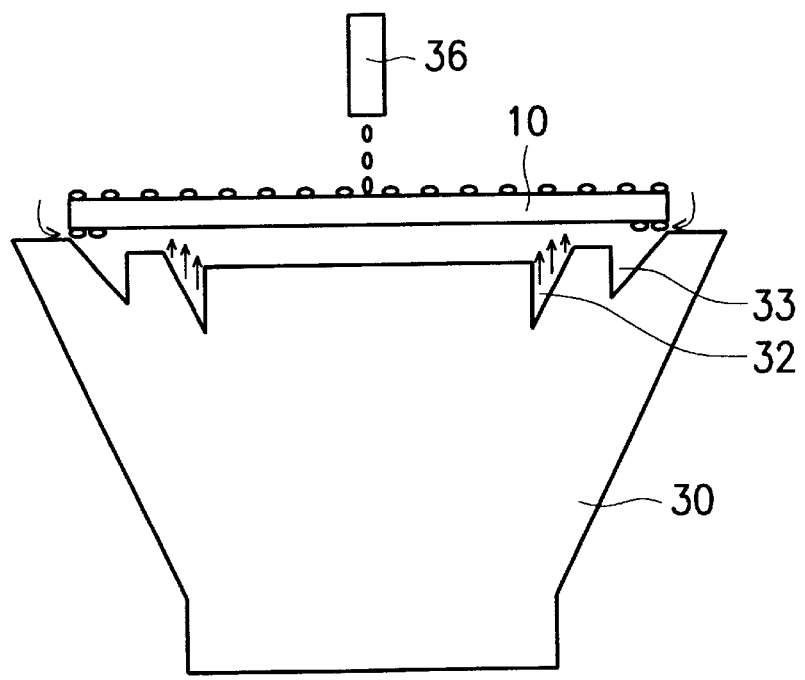
FIG. 10 illustrates the L–L' cross section of FIG. 8.

The machine for etching the edge of a wafer having Si-needles on its frontside according to the present invention comprises: a rotating holding plate 30 having a work platform, the work platform having a first fillister 32 for spraying gas to maintain a certain distance between the work platform and the wafer, a second fillister 33 set around the periphery of the first fillister for reducing pressure of the sprayed gas at the edge of the wafer, and a plurality of holding pins 34; a vacuum manipulator 31 (not shown); and an etching solution leading apparatus 36.

The function of the etching machine of this invention is described as follows. In this embodiment, gas is sprayed at a rate of 130 L/min from the gas spraying fillister 32. The gas is preferably nitrogen. The wafer to be etched is gripped by the vacuum manipulator 31 and placed on the work platform of the rotating holding plate 30, wherein the frontside of the wafer faces towards the work platform and the backside of the wafer faces towards the etching solution leading apparatus 36. The cross sectional structure of the silicon wafer 10, as shown in FIG. 1, comprises deep trenchs 15 and Si-needles 16 consisting of a silicon nitride layer 14, a silicon dioxide layer 12 and a portion of silicon substrate 10. The nitrogen sprayed on the frontside of the wafer maintains a certain distance between the frontside of the wafer and the work platform, such that they do not contact. The holding pins 34 are contacted with the wafer 10, fixing the wafer 10 such that the wafer 10 can be rotated by the holding plate at preferable speed of between 30 and 180 rpm. In this embodiment, there are six holding pins, though it is understood that the number of pins can be varied. The holding pins can cylindrical-shaped and equally distributed around the periphery of the wafer 10. Etching solution is lead from the etching solution leading apparatus 36 to the backside of the wafer with a preferable flow rate of around 1700 ml/min, such that the etching solution gradually diffuses to the edge of the backside of the wafer 10, and then permeates around to the edge of the frontside of the wafer, thereby etching the Si-needles at the edge of the frontside of the wafer. The gas sprayed by the first fillister 32 prevents etching solution from permeating to the central part of the frontside of the wafer. The second fillister, on the other hand, reduces the pressure of the gas in the area facing the edge of the wafer 10, allowing the etching solution to etch the Si-needles located there. In this embodiment, the etching solution consists of 60 wt % of $HNO_3$, 7 wt % of HF and 33 wt % of water, though it is understood that other recipes may be used. Preferably, the etching temperature is maintained at 25° C.

Because the etching solution can not permeate past the portion of the edge contacted with the holding pins 34, the wafer 10 is released briefly by the holding pins 34 and then gripped again, such that the postion of the wafer 10 shifts position. By this means, etching solution may permeate to the entire edge of the frontside of the wafer. The whole etching process proceeds ten seconds.

Since the second fillister set around the periphery of the first fillister effectively reduces the gas pressure between the wafer and the workplatform in the area facing the edge of the frontside of the wafer, the etching solution easily permeates to the edge of the frontside of the wafer. Therefore, the photoresist is not necessary.

Therefore, the Si-needles on the frontside of the wafer about 2 mm from the periphery can be remove completely, making the edge of the wafer smooth. Thereafter, subsequent processes using a clamp manipulator to grip the edge of the wafer will not break Si-needles on the frontside of the wafer.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. A machine for etching the edge of a wafer having a frontside and a backside, comprising:
   a rotating holding plate having a work platform, the work platform having a first fillister for spraying gas, a second fillister set around the periphery of the first fillister, and a plurality of holding pins for gripping and rotating the wafer;
   an etching solution leading apparatus facing the work platform; and a manipulator for gripping and moving the wafer to a position between said work platform and said etching solution leading apparatus, wherein the frontside of the wafer faces towards said work platform and the backside of the wafer faces towards said etching solution leading apparatus;

wherein, the gas sprayed from the first fillister maintains a certain distance between the wafer and the workplatform, while the second fillister reduces the pressure of the gas at the edge of the frontside of the wafer such that etching solution lead to the backside of the wafer may permeate to the edge of the frontside of the wafer.

2. The machine as claimed in claim 1, wherein the holding pins are cylindrical-shaped.

3. The machine as claimed in claim 1, wherein six holding pins are provided.

4. The machine as claimed in claim 1, wherein the rotational speed of the rotating holding plate is between 150 and 300 rpm.

5. The machine as claimed in claim 1, wherein said gas is nitrogen.

6. The machine as claimed in claim 1, wherein the holding pins briefly release the wafer and then grip the wafer such that the postion of the wafer shifts, thereby allowing etching solution to permeate to the entire edge of the frontside of the wafer.

7. A method of etching the edge of a wafer having a frontside and a backside with a single wafer etching machine having a work platform with a first fillister, a second fillister set around the periphery of the first fillister, and a plurality of holding pins, and an etching solution leading apparatus, the method comprising:

spraying gas from the first fillister;

disposing the wafer on the work platform with the frontside of the wafer facing towards the work platform and the backside of the wafer facing towards the etching solution leading apparatus, wherein the gas sprayed from the first fillister maintains a certain distance between the frontside of the wafer and the work platform;

gripping the wafer with the holding pins and rotating the wafer; and leading etching solution from the etching solution leading apparatus to the backside of the wafer, wherein in the reduced pressure of the sprayed gas at the edge of the wafer resulting from the second fillister allows the etching solution to easily permeate to the edge of the frontside of the wafer, thereby etching the edge of the frontside of the wafer.

8. The mathod as claimed in claim 7, further including the step releasing the wafer for a short perdiod of time and then gripping the wafer again so as to shift the position gripped by the holding pins, such that the edge of the wafer originally gripped by the holding pins is also etched.

9. The method as claimed in claim 7, wherein the rotational speed of said rotating holding plate is between 150 and 300 rpm.

10. The method as claimed in claim 7, wherein said gas is nitrogen.

\* \* \* \* \*